United States Patent [19]
Kobayashi et al.

[11] Patent Number: 5,643,427
[45] Date of Patent: Jul. 1, 1997

[54] MAGNETRON CATHODE

[75] Inventors: Masahiko Kobayashi; Nobuyoki Takahashi, both of Fuchu, Japan

[73] Assignee: Anelva Corporation, Fuchu, Japan

[21] Appl. No.: 534,646

[22] Filed: Sep. 27, 1995

Related U.S. Application Data

[62] Division of Ser. No. 305,837, Sep. 14, 1994, Pat. No. 5,514,257.

[30] Foreign Application Priority Data

Oct. 22, 1993 [JP] Japan .................... 5-264770

[51] Int. Cl.$^6$ .................................... C23C 14/34
[52] U.S. Cl. .................. 204/298.2; 204/192.12; 204/298.19
[58] Field of Search ............ 204/192.12, 298.19, 204/298.2

[56] References Cited

U.S. PATENT DOCUMENTS 5,047,130  9/1991  Akao et al. ............... 204/298.2 X
5,120,417  6/1992  Takahashi et al. ........ 204/298.2 X
5,282,947  2/1994  Brugge et al. ............ 204/298.2

FOREIGN PATENT DOCUMENTS 1268867  10/1989  Japan ..................... 204/298.2

*Primary Examiner*—Nam Nguyen
*Attorney, Agent, or Firm*—Burns, Doane, Swecker & Mathis, LLP

[57] ABSTRACT

A method for forming Ti—TiN laminates adapted to reduce the formation of dust particles harmful to semiconductor devices without detriment to productivity, and a magnetron cathode for performing the method are provided. Ti films and TiN films are formed through sputtering of a Ti target using a multi-chamber system comprising at least two chambers each having a magnetron cathode in which a magnet can be moved to accommodate different films. The type of film being formed in each chamber is periodically alternated to prevent a buildup of TiN film adhered to the inner walls of the chambers which peels and causes dust particles.

11 Claims, 4 Drawing Sheets

MAGNETRON CATHODE

This application is a divisional of application Ser. No. 08/305,837, filed Sep. 14, 1994 now U.S. Pat. No. 5,514,257.

BACKGROUND OF THE INVENTION

1. Field of the Invention

The present invention relates to a method for forming Ti—TiN laminates and a magnetron cathode suitable for continuously forming laminated layers of Ti (titanium) and TiN (titanium nitride) on the surface of a substrate.

2. Description of the Related Art

Conventionally, Ti—TiN laminates are used as ground barrier layers underlying aluminum films for wiring in semiconductor devices. With increases in the integration density of semiconductor devices, it has become necessary to improve the uniformity of the thicknesses of the Ti and TiN films. Additionally, there has been a problem of dust particles which are produced when TiN film adheres to an inner wall of the chamber and peels off in the TiN film formation process. These dust particles result in reductions in the yield of semiconductor devices.

Ti—TiN laminates are generally formed by first forming a Ti thin film by magnetron sputtering using a Ti target and then forming a TiN thin film by reactive magnetron sputtering by introducing a mixture of argon gas and nitrogen gas into the same chamber. However, a disadvantage of this process is that it is difficult to achieve good thickness distributions in both films when they are both formed in the same chamber with the same magnetron cathode.

Accordingly, the process for forming the Ti film and the process for forming the TiN film have been carried out in separate chambers having magnetron cathodes that can achieve good thickness distributions. In the Ti—TiN laminates formation process, it is suitable to use a multi-chamber system provided with a chamber for the Ti film formation process and a chamber for the TiN film formation process.

In order to form Ti—TiN laminates with the multi-chamber system, first a substrate is transferred into a first chamber for the Ti film formation process by a robot and a Ti film is formed by magnetron sputtering. After that, the substrate is transferred into a second chamber for the TiN film formation process and a TiN film is formed on the Ti film by reactive magnetron sputtering. However, fine dust particles, which are harmful to the devices being manufactured, increase as the formation process of the TiN film is continuously repeated in the chamber for the TiN film formation process. Through continuous repetition of the TiN film formation process, the TiN film deposited on the inner wall of the chamber becomes thicker and then peels off due to high internal stresses in the TiN film. The TiN which peels off the walls of the chamber becomes a source of particulate contamination.

One possible solution for preventing the dust particles from being produced is the technique of periodically coating the unwanted TiN film adhered to the inner wall of the chamber with a Ti film, for example one Ti coating per processing of 100 substrates, by Ti sputtering. Although this method allows fixing of the TiN film, with the Ti coating, it lowers the yield because the continuous production of Ti and TiN films is interrupted.

OBJECTS AND SUMMARY

Accordingly, it is an object of the present invention to solve the aforementioned problems by providing a method for forming Ti—TiN laminates which is adapted to reduce dust particles harmful to semiconductor devices and to achieve good thickness distributions in the Ti and TiN films. It is also an object to provide a magnetron cathode which is suitable for use in the method.

A preferred embodiment of the present invention involves a method for forming Ti—TiN laminates in a multi-chamber system having at least two chambers for magnetron sputtering processes. Each of the chambers comprises a magnetron cathode having a Ti target, a circular band magnet truncated by two parallel straight lines and a trapezoidal magnet disposed within the circular band magnet. A process for forming a Ti film is carried out within one of the chambers by magnetron sputtering and a process for forming a TiN film is carried out within the other chamber by reactive magnetron sputtering. The process comprises the steps of:

(1) carrying out the TiN film formation process on a substrate after carrying out the Ti film formation process thereon;

(2) alternating the TiN film formation process and the Ti film formation process within each chamber before the TiN film adhered to an inner wall of the chamber, where the process for forming TiN film is being carried out, reaches a thickness great enough to cause the peeling thereof; and (3) shifting the position of a trapezoidal magnet at the alternation so that the thickness distributions of the films are uniform.

The process in each chamber is alternated before the TiN film adhered to the inner wall of the chamber reaches 30 microns thick at which point the amount of dust particles may become unacceptably high. The TiN film reaches a thickness of 30 microns after the process of TiN coating is performed on about 300 substrates. Therefore, according to a preferred embodiment of the process, the process in each chamber is alternated when the number of substrates on which the process for forming the Ti—TiN laminates is implemented reaches 100.

A trapezoidal magnet of the preferred embodiment is disposed inside a circular band magnet on a sliding plate so that the longer side thereof faces one of the chords of the circular band magnet which is of greater band thickness than the other chord. A middle point of the longer side of the trapezoidal magnet sits on the axis of symmetry of the truncated circular band magnet, and the trapezoidal magnet shifts along this axis of symmetry.

The trapezoidal magnet shifts when alternating between the Ti and TiN film formation processes so that the thickness variations of the Ti and TiN films are less than 5%. The trapezoidal magnet moves over a range such that the distance between the longer side of the trapezoidal magnet and the thicker chord portion of the truncated circular band magnet preferably varies from about 34 mm to about 42 mm. The distance between the longer side of the trapezoidal magnet and the thicker chord portion of the truncated circular band magnet is preferably about 34 mm during the Ti film formation process and preferably about 42 mm during the TiN film formation process.

A magnetron cathode which is suited for the method for forming the films described above includes a target, a holder for holding the target, a magnet assembly as described above, a main shaft for transmitting a rotary motion to rotate the magnet assembly, and a rotating mechanism for rotating the main shaft. A cylinder is formed within the main shaft. Passages for fluid to flow in and out through the shaft are connected to the ends of the cylinder. The cylinder contains a piston to which the sliding plate is linked in order to move the trapezoidal magnet when alternating between the Ti and TiN formation processes.

According to the present invention, the formation of the Ti film or TiN film is alternated every time or after a plurality of times within one chamber. Therefore, the unwanted TiN film on the inner wall of the chamber which causes dust particles is coated periodically with a Ti coating and is prevented from peeling off without the continuous production of Ti—TiN laminates being interrupted.

The uniformity of thicknesses of the Ti and TiN films may be improved by changing the distribution of the magnetic field over the target in each magnetron sputtering process. The distribution of the magnetic field is changeable through movement of a magnet in the magnetron cathode.

The manner in which the foregoing and other objects of the present invention are accomplished will be apparent from the accompanying specification and claims considered together with the appended drawings.

BRIEF DESCRIPTION OF THE DRAWINGS

FIG. 2b is a section view along line A—A of the magnetic assembly of FIG. 2a;

FIG. 3b is a section view along line B—B of the magnetic assembly of FIG. 3a.

DETAILED DESCRIPTION OF THE PREFERRED EMBODIMENT

Figure 1A:
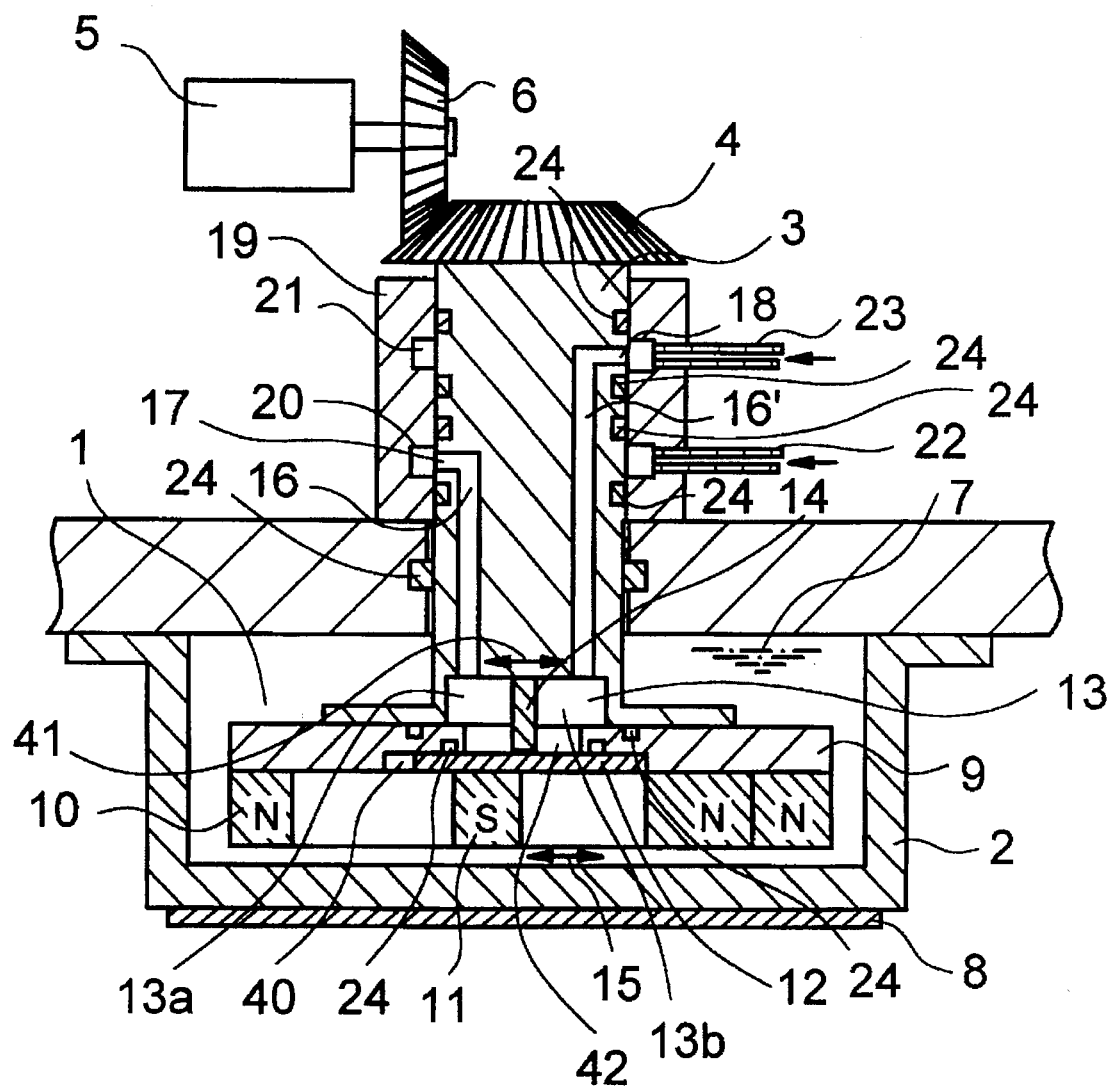
FIG. 1a is a section view of a magnetron cathode.

Referring now to the drawings, a preferred embodiment of the present invention will be explained.

Figure 1B:
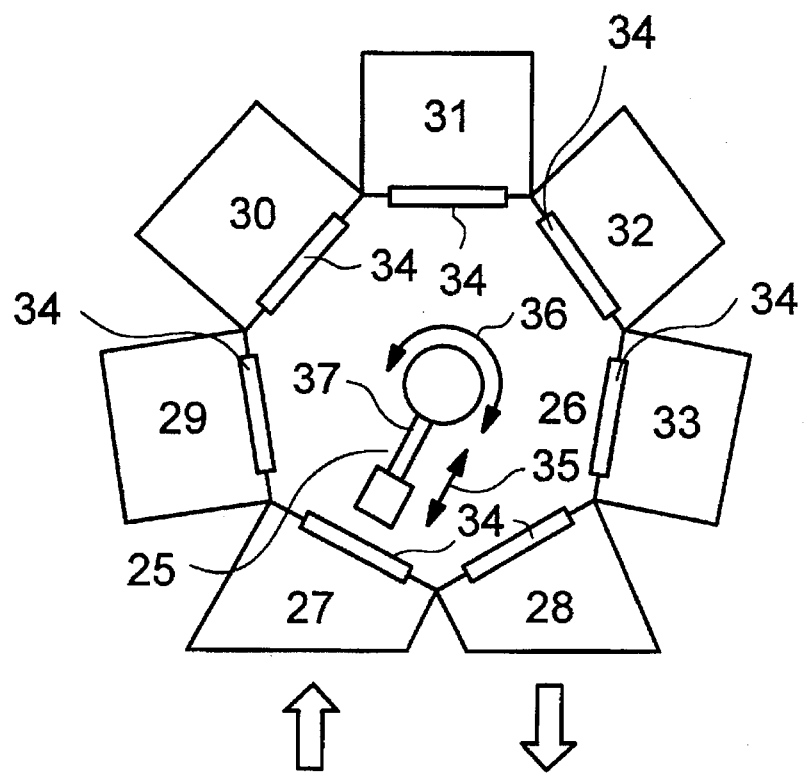
FIG. 1b is a diagram of a multi-chamber system.
Figure 1C:
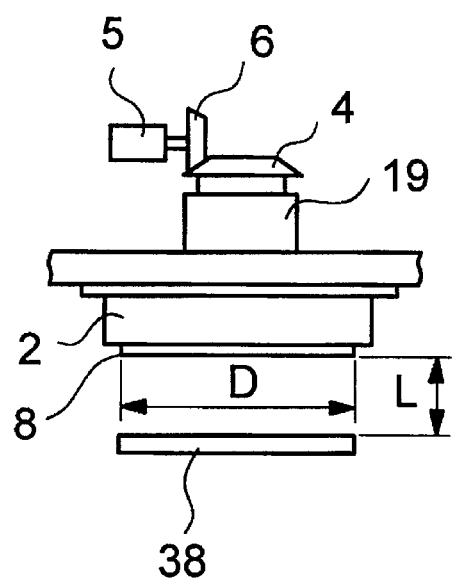
FIG. 1c is a side view of a magnetron cathode showing the relationship between a target holder and a substrate holder.

FIGS. 1a through 1c show a preferred embodiment of a magnetron cathode of the present invention, wherein a magnet assembly 1 for the magnetron cathode is provided within a target holder 2. A main shaft 3 is mounted on the back of a yoke plate 9 of the magnet assembly 1. The main shaft 3 protrudes out through the housing of the chamber. A bevel gear 4 on the end of the main shaft 3 meshes with a bevel gear 6 on the end of the shaft of a driving motor 5. The magnet assembly 1 is rotated by transmission of rotary motion from the shaft of the driving motor 5 to the main shaft 3. Cooling water 7 circulates within the target holder 2 to cool down a Titanium (Ti) target 8.

The magnet assembly 1 for the magnetron cathode is made up of the yoke plate 9, an N pole permanent magnet 10 and an S pole permanent magnet 11 as shown in FIG. 2. The magnet 10 is a circular band magnet truncated by two parallel straight chords. The outside edges of these two parallel straight chords are equidistant from the center point 0 of the circular magnet 10. The thicknesses of the two chords are different. The Y chord comprises two separate parallel parts Ya and Yb. Therefore, the total thickness of the band of the chord Y is greater than that of the band of the chord X. The circular band magnet 10 is symmetrical about a straight line A—A.

Figure 2A:
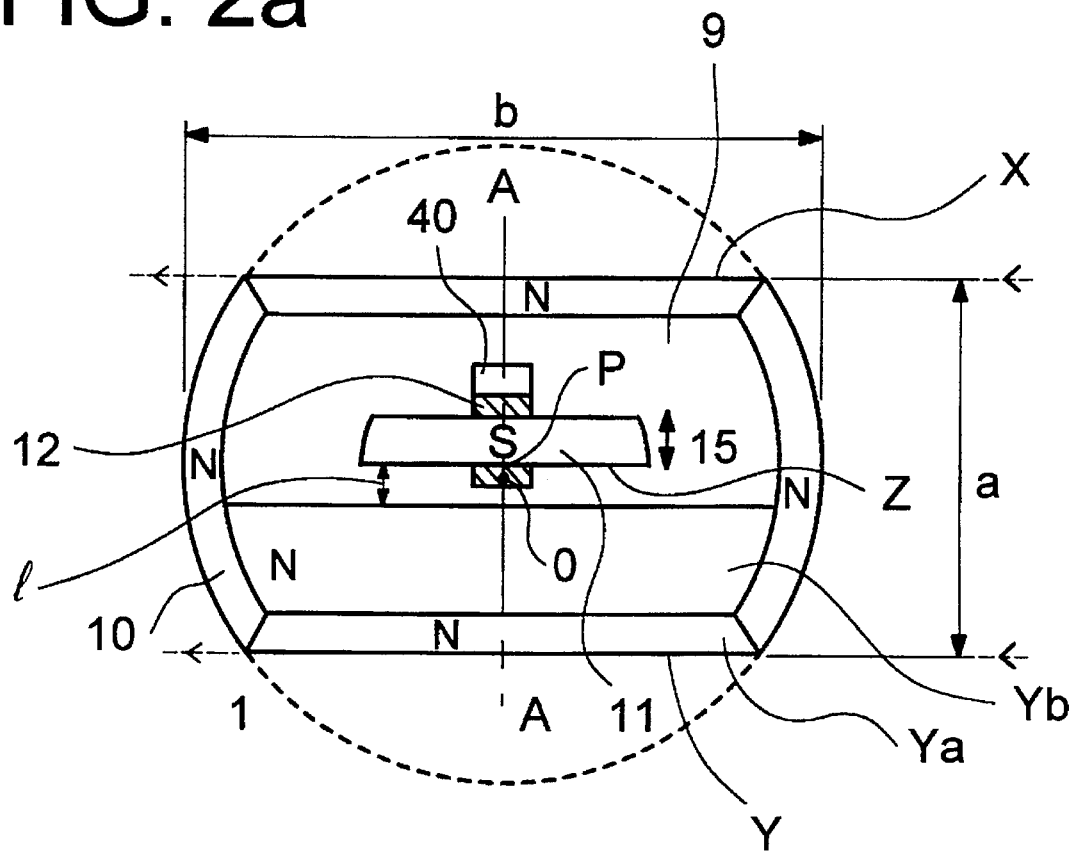
FIG. 2a is a bottom plan view of a magnetic assembly according to a first embodiment of the invention.
Figure 2B:
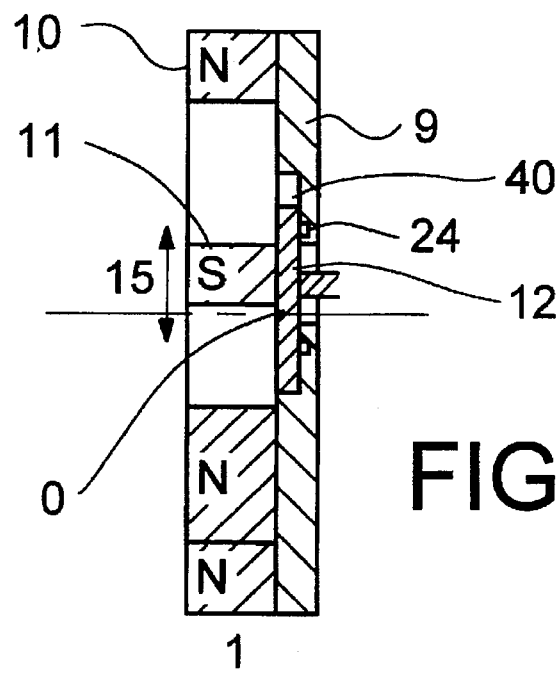

As shown in FIGS. 2a and 2b, the magnet 11 is trapezoidal with four corners which are rounded. The trapezoidal magnet 11 is disposed within the circular band magnet 10 and is positioned so that the longer side Z thereof faces the chord Y of the circular band magnet 10 and the middle point P of the bottom side Z sits on the axis of symmetry A—A of the circular band magnet 10. However, the trapezoidal magnet 11 does not overlap the center point 0 of the circular band magnet 10. If the trapezoidal magnet 11 were to overlap the center point 0, dust particles would be generated because the central region of the target 8 would not be subjected to sputter etching due to there being no magnetron plasma over the central region. Then particles (atoms) of the sputtered target would adhere to the region not sputter etched, depositing a film. Dust particles would be produced when the deposited film on the region is peeled off.

According to a preferred embodiment of the magnetic assembly, shown in FIGS. 2a and 2b the trapezoidal magnet 11 is disposed in a position such that the distance between the bottom side Z of the trapezoidal magnet 11 and the chord Y of the circular band magnet 10 is about 34 mm without the trapezoidal magnet 11 overlapping the center point 0. Ferrite or rare earth magnets may be used for the magnets 10 and 11. The trapezoidal magnet 11 is mounted on a sliding plate 12 so that the trapezoidal magnet 11 can move on the yoke plate 9. The sliding plate 12 is disposed in a recess 40 in the yoke plate 9 and moves within the recess 40.

A cylindrical cavity 13 is isolated by the sliding plate 12 from the space within the target holder 2 even when the sliding plate 12 moves to the upper or lower edge of the recess 40. The sliding plate 12 is connected to a piston 14 through a space 42 communicating between the recess 40 and the cylindrical cavity 13. When the piston 14 moves in the direction of arrow 41 within the cylindrical cavity 13, the trapezoidal magnet 11, together with the sliding plate 12, moves along the axis A—A in the direction of arrow 15.

Spaces 13a and 13b are formed by the partitioning of the space in the cylindrical cavity 13 by the piston 14. The spaces 13a and 13b communicate respectively with passages 16 and 16' formed within the main shaft 3. Circular channels 20 and 21 are formed in the inner wall of an outer cylinder 19 at the same heights as openings 17 and 18 of the passages 16 and 16' in the side wall of the main shaft 3. Pressurized air, oil or some other pressurized fluid may be introduced into the space 13a or 13b of the cylinder 13 via the circular channels 20 and 21 and the passages 15 and 16 from pipes 22 and 23. The piston 14 is moved by creating differences between the pressures in the spaces 13a and 13b. The traveling distance of the trapezoidal magnet 11 may be adjusted by adjusting the pressure of the pressurized fluid. However, even if the trapezoidal magnet 11 can be moved through the center point 0 of the circular band magnet 10, it is preferably not set on the center point 0 in order to prevent dust particles from being generated. The reference numeral 24 denotes packings such as O-rings which are used to seal the various fluid cavities.

Figure 3A:
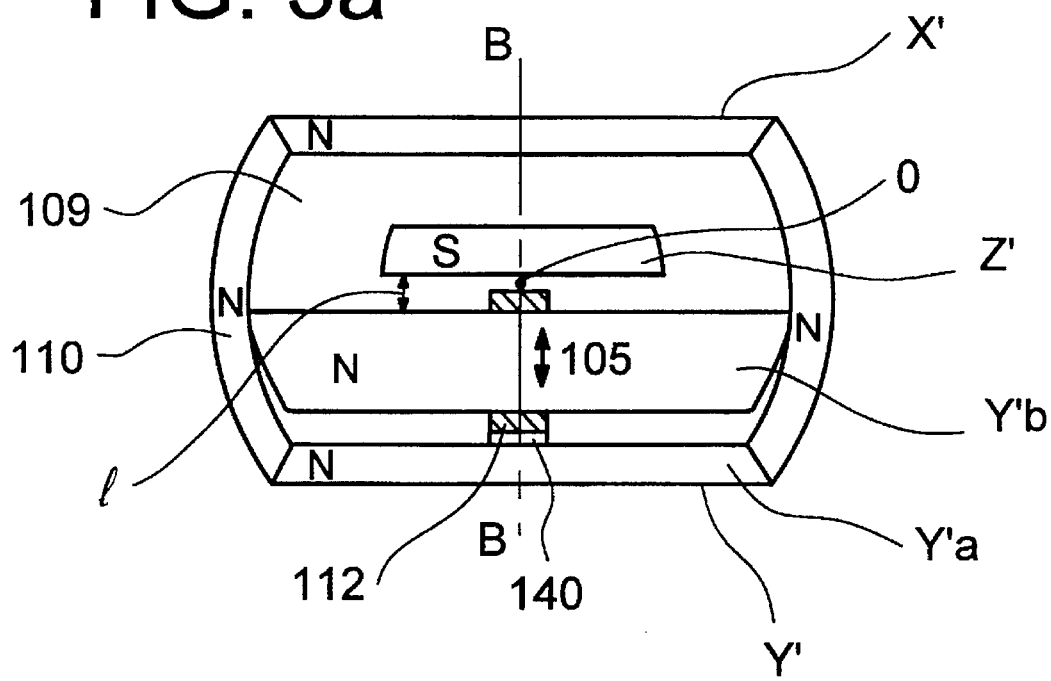
FIG. 3a is a bottom plan view of a magnetic assembly according to a second embodiment of the invention.
Figure 3B:
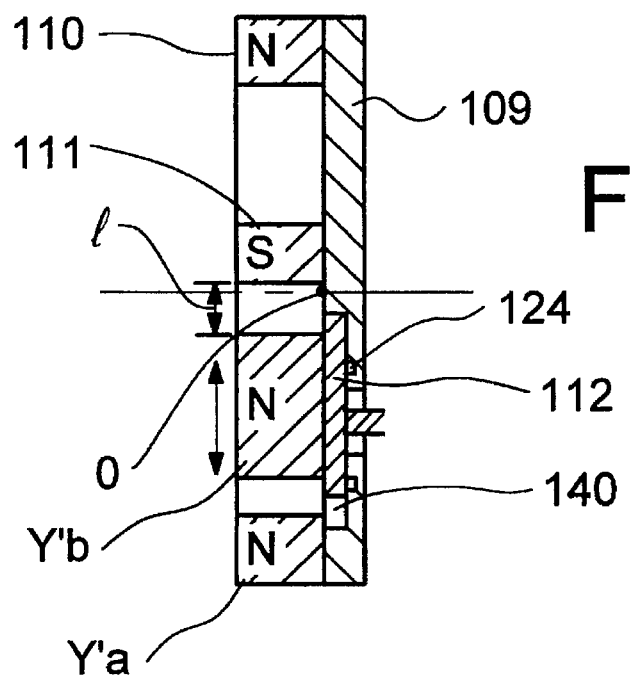

In an alternative embodiment of the magnetic assembly, as shown in FIGS. 3a and 3b, the magnet 111 is preferably fixed and the portion of the chord Yb' is mounted on the sliding plate 112. The sliding plate 112 is disposed in the recess 140 in the yoke plate 109 and moves within the recess. This embodiment operates in a similar manner as the embodiment shown in FIGS. 2a and 2b. The magnet chord Yb' can be shifted along the axis of symmetry B—B of the circular band magnet 10. The shifting of the chord Yb' is performed when alternating between the Ti and TiN film formation processes so that the thickness variations of the Ti and TiN films are less than 5%

FIG. 1b shows a multi-chamber system used in a preferred embodiment of the invention. A substrate loading chamber 27, a substrate unloading chamber 28 and processing chambers 29, 30, 31, 32 and 33 are connected through gate valves 34 to a main chamber 26 in which a transferring robot 25 is disposed. A vacuum pump (not shown) is connected to each chamber to allow each chamber to be evacuated separately. The transferring robot 25 is provided with an arm 37 having degrees of freedom, for example in the directions of arrows 35 and 36 and in the direction normal to the plane of the drawing.

A substrate to be processed is transferred by the transferring robot 25 from the substrate loading chamber 27 to processing chambers 29 through 33 and the substrate is subjected to the film formation and other processes in the processing chambers 29 through 33. In chamber 33 the substrate is heated to release unwanted molecules such as $H_2O$ molecules absorbed on the substrate surface. Then the substrate is transfered to chamber 29 where the impurities naturally growing on the surface of the substrate such as $SiO_2$ are shaved off by Ar plasma etching. After the preliminary processing of the substrates in chambers 29 and 33 the substrates are transferred to chambers 30 and 31 where Ti and TiN films are formed. The substrates are then transferred to chamber 32 where an Al film for wiring is deposited on the Ti—TiN laminates. The processed substrate is then transferred to the substrate unloading chamber 28 by the robot 25. A transferring robot and transferring method suitable for the multi-chamber system are disclosed in U.S. Pat. No. 5,288,379, the subject matter of which is incorporated herein by reference.

A magnetron cathode provided with the magnet assembly 1 described above is provided in each of the two processing chambers 30 and 31. The substrate is placed on a substrate holder 38 shown in FIG. 1c by the robot 25. Pipes (not shown) for introducing argon gas and a mixture of argon gas and nitrogen gas are connected to the processing chambers 30 and 31 to enable implementation of both the magnetron sputtering process for forming Ti film and the reactive magnetron sputtering process for forming TiN film. The diameter D of the Ti disc target 8 is preferably about 314 mm and the distance L between the target 8 and the substrate holder 38 is preferably about 60 mm. Further, the dimension (a) of the magnet assembly 1 shown in FIG. 2a is preferably about 248 mm and the dimension (b) is preferably about 352 mm. The distance (l) between the trapezoidal magnet 11 and the chord Y of the circular band magnet 10 is preferably from 34 mm to 42 mm and the trapezoidal magnet 11 can move within that range.

In forming the Ti—TiN laminates on the surface of the substrate in the multi-chamber system described above, the TiN film formation process is commenced in chamber 30 while the Ti film formation process is carried out in chamber 31. After about 100 substrates have been processed the chambers are alternated and the TiN film formation process commences in chamber 31 while the Ti film formation process is carried out in chamber 30. The chambers are repeatedly alternated between Ti and TiN preferably every 100 executions but not more than every 300 executions.

In this way, the TiN film adhered to the inner wall of the processing chambers 30 and 31 (including a shield for preventing the film from adhering to the inner wall) is periodically covered with a Ti film and the peeling of the TiN film having high internal stresses is prevented. As a result, formation of dust particles is greatly reduced.

Specifically, the number of dust particles on the Ti—TiN laminates may be reduced to less than 10/300 cm$^2$ by this process. When the TiN film deposited on the inner wall of the processing chamber reaches 30 microns, the peeling of the TiN film becomes marked and the number of dust particles on a 6 inch wafer reaches more than 50. The maximum allowable number of dust particles on a substrate from the aspect of quality control of the semiconductor devices is 50 per 6 inch wafer. The thickness of the TiN film on the inner wall reaches 30 microns when the TiN film formation process has been performed on about 300 substrates. Accordingly, it is necessary to alternate from one film formation process to the other film formation process in both processing chambers before the TiN film formation process is performed on 300 substrates.

One problem experienced when Ti and TiN films are formed using the same magnetron cathode is that even thickness distributions cannot be achieved for both films. According to the present embodiment this problem is solved by providing an adjustable magnet. The position of the trapezoidal magnet 11 of the magnet assembly 1 is adjusted by means of the piston 14 by adjusting the pressurized air within the spaces 13a and 13b. The distance (l) between the trapezoidal magnet 11 and the circular band magnet 10 is preferably set at about 34 mm when a Ti film is to be formed and set at about 42 mm when a TiN film is to be formed. As a result, a thickness variation of less than 5% can be achieved for both the Ti films and the TiN films.

EXAMPLE 1

The thickness variation of a Ti film was 1 to 1.5% when the Ti film was formed by setting the pressure of argon gas (the process gas) at 4 mTorr, the power applied to the Ti target 8 at 5 kW and the distance (l) at 34 mm. The thickness variation of the Ti film was 10 to 15% when the distance (l) was set to 42 mm and the other conditions were the same.

EXAMPLE 2

The thickness variation of a TiN film was 7 to 10% when the TiN film was formed by using a mixture of argon gas and nitrogen gas as the process gas (flow ratio (sccm) argon gas:nitrogen gas=15:85) and by setting the pressure of the mixture at 4.5 mTorr, the power applied to the Ti target 8 at 6 kW and the distance (l) at 34 mm. The thickness variation of the TiN film was 3 to 4% when the distance (l) was set to 42 mm and the other conditions were the same.

Instead of shifting the trapezoidal magnet 11, it is also possible to move the circular band magnet 10. It is the relative position of the circular band magnet 10 and the trapezoidal magnet 11 which is important. Further, while the magnets in the above preferred embodiment were permanent magnets, it is within the scope of the invention to use electromagnets and change the exciting current of the electromagnets to change the distribution of the magnetic field.

As described above, according to the present invention, two chambers comprising magnetron cathodes in which the position of a magnet can be changed are used to periodically alternate the Ti film formation process in one chamber and the TiN film formation process in the other chamber, so that dust particles may be prevented from forming and good thickness distributions in the Ti and TiN films can be achieved. As a result, the productivity of the process and the quality of the semiconductor devices produced are improved.

While a preferred embodiment has been described, variations thereto will occur to those skilled in the art within the scope of the present inventive concepts which are delineated by the following claims.

What is claimed is:

1. A magnetron cathode comprising:

a target;

a target holder;

a yoke plate within the target holder;

a sliding plate within the yoke plate;

a magnet assembly having a circular band magnet truncated by two parallel chords on the yoke plate and a trapezoidal magnet on the sliding plate, wherein said trapezoidal magnet is disposed within said truncated circular band magnet so that a longer side of said trapezoidal magnet does not overlap a center point of the truncated circular band magnet and a middle point of said longer side lies on an axis of symmetry of said truncated circular band magnet;

a main shaft for transmitting a rotary motion to rotate said magnet assembly;

a cylindrical cavity is formed within said main shaft, said cylindrical cavity containing a piston to which the sliding plate is linked so that said trapezoidal magnet is moveable relative to said circular band magnet by moving said piston; and a rotating mechanism for rotating said main shaft.

2. The magnetron cathode according to claim 1, wherein the trapezoidal magnet has an opposite magnetic pole from that of said circular band magnet, and one of the two chords has a greater band thickness than another of the two chords.

3. The magnetron cathode according to claim 2, wherein said trapezoidal magnet moves over a range such that the distance between said longer side of said trapezoidal magnet and said one chord of said circular band magnet varies from about 34 mm to about 42 mm.

4. The magnetron cathode according to claim 2, wherein said distance between said longer side of said trapezoidal magnet and said one chord of said circular band magnet is set at about 34 mm during the Ti film formation process and at about 42 mm during the TiN film formation process.

5. The magnetron cathode according to claim 1, further comprising passages for fluid flow in said main shaft connected to ends of said cylindrical cavity.

6. The magnetron cathode according to claim 1, further comprising channels leading to the cylindrical cavity so that pressurized fluid may be introduced into the cylindrical cavity to move the piston.

7. The magnetron cathode according to claim 1, wherein the trapezoidal magnet is movable along said axis of symmetry of said truncated circular band magnet by moving said piston.

8. A magnetron cathode comprising:

a target;

a target holder;

a yoke plate within the target holder;

a sliding plate within the yoke plate;

a magnet assembly having a circular band magnet truncated by two parallel chords, said circular band magnet including a first portion secured to the yoke plate and a second portion secured to said sliding plate;

a second magnet secured to said yoke plate within said truncated circular band magnet so that a longer side of said second magnet does not overlap a center point of the truncated circular band magnet and a middle point of said longer side lies on an axis of symmetry of said truncated circular band magnet;

a main shaft for transmitting a rotary motion to rotate said magnet assembly, wherein a cylindrical cavity is formed within said main shaft, said cylindrical cavity containing a piston to which the sliding plate is linked so that movement of the piston causes said second magnet to move relative to said circular band magnet; and a rotating mechanism for rotating said main shaft.

9. The magnetron cathode according to claim 8, wherein the movement of the piston causes said second magnet to move along the axis of symmetry of the truncated circular band magnet.

10. A magnetron cathode comprising:

a target;

a target holder;

a yoke plate within the target holder;

a sliding plate within the yoke plate;

a magnet assembly having a circular band magnet truncated by two parallel chords, said circular band magnet secured to the yoke plate;

a second magnet secured to said sliding plate within said truncated circular band magnet so that a longer side of said second magnet does not overlap a center point of the truncated circular band magnet and a middle point of said longer side lies on an axis of symmetry of said truncated circular band magnet;

a main shaft for transmitting a rotary motion to rotate said magnet assembly, wherein a cylindrical cavity is formed within said main shaft, said cylindrical cavity containing a piston to which the sliding plate is linked so that movement of the piston causes said second magnet to move relative to said circular band magnet; and a rotating mechanism for rotating said main shaft.

11. The magnetron cathode according to claim 10, wherein the movement of the piston causes the second magnet to move along the axis of symmetry of the truncated circular band magnet.

* * * * *